United States Patent
Smirnov et al.

(10) Patent No.: US 8,064,148 B2
(45) Date of Patent: Nov. 22, 2011

(54) HIGH NUMERICAL APERTURE CATADIOPTRIC OBJECTIVES WITHOUT OBSCURATION AND APPLICATIONS THEREOF

(75) Inventors: Stanislav Y. Smirnov, Bethel, CT (US); Eric Brian Catey, Danbury, CT (US); Adel Joobeur, Milford, CT (US)

(73) Assignee: ASML Holding N.V., Veldhoven (NL)

( * ) Notice: Subject to any disclaimer, the term of this patent is extended or adjusted under 35 U.S.C. 154(b) by 156 days.

(21) Appl. No.: 12/419,565

(22) Filed: Apr. 7, 2009

(65) Prior Publication Data

US 2009/0257053 A1 Oct. 15, 2009

Related U.S. Application Data

(60) Provisional application No. 61/045,125, filed on Apr. 15, 2008.

(51) Int. Cl.
*G02B 17/00* (2006.01)

(52) U.S. Cl. ......... 359/727; 359/726; 359/733; 359/900

(58) Field of Classification Search .................. 359/726, 359/727, 642, 730, 733, 735, 736, 793, 831, 359/833, 900
See application file for complete search history.

(56) References Cited

U.S. PATENT DOCUMENTS

| | | | |
|---|---|---|---|
| 5,717,518 A | 2/1998 | Shafer et al. | |
| 5,999,310 A | 12/1999 | Shafer et al. | |
| 6,064,517 A | 5/2000 | Chuang et al. | |
| 6,108,140 A * | 8/2000 | Hashimoto et al. | 359/727 |
| 6,208,473 B1 * | 3/2001 | Omura | 359/727 |
| 6,229,647 B1 * | 5/2001 | Takahashi et al. | 359/485.07 |
| 7,035,001 B2 | 4/2006 | Chuang et al. | |
| 7,136,234 B2 | 11/2006 | Shafer et al. | |
| 7,180,658 B2 | 2/2007 | Shafer et al. | |
| 7,245,438 B2 | 7/2007 | Chuang et al. | |
| 7,351,980 B2 | 4/2008 | Lange | |

* cited by examiner

*Primary Examiner* — Jack Dinh
(74) *Attorney, Agent, or Firm* — Sterne, Kessler, Goldstein & Fox P.L.L.C.

(57) ABSTRACT

Disclosed are high numerical (NA) catadioptric objectives without a central obscuration, and applications thereof. Such objectives can operate through a wide spectral bandwidth of radiation, including deep ultraviolet (DUV) radiation. Importantly, refractive elements in the catadioptric objectives can be manufactured from a single type of material (such as, for example, $CaF_2$ and/or fused silica). In addition, the elements of such catadioptric objectives are rotationally symmetric about an optical axis. The catadioptric objectives eliminate the central obscuration by (1) using a polarized beamsplitter (which passes radiation of a first polarization and reflects radiation of a second polarization), and/or (2) using one or more folding mirrors to direct off-axis radiation into the pupil of the catadioptric objective. An example catadioptric objective is shown in FIG. 2.

17 Claims, 10 Drawing Sheets

HIGH NUMERICAL APERTURE CATADIOPTRIC OBJECTIVES WITHOUT OBSCURATION AND APPLICATIONS THEREOF

CROSS REFERENCE TO RELATED APPLICATIONS

This application claims benefit under 35 U.S.C. §119(e) to U.S. Provisional Patent Application No. 61/045,125, entitled "High Numerical Aperture Objective Without Obscuration and Applications Thereof," to Smirnov et al., filed Apr. 15, 2008, the entirety of which is hereby incorporated by reference as if fully set forth herein.

BACKGROUND

1. Field of the Invention

The present invention generally relates to lithography, and more particularly to systems and methods for inspecting an object (such as, a reticle or wafer) of a lithography system.

2. Background Art

Lithography is widely recognized as a key process in manufacturing an integrated circuit (IC) as well as other devices and/or structures. A lithographic apparatus is a machine, used during lithography, which applies a desired pattern onto a substrate, such as onto a target portion of the substrate. During manufacture of ICs with a lithographic apparatus, a patterning device—which is alternatively referred to as a mask or a reticle—generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

To ensure that the pattern is properly transferred to the target within appropriate tolerances, the reticle and/or the substrate (e.g., silicon wafer) on which the IC is printed may be inspected for defects or other characteristics. An object (e.g., reticle or wafer) can be inspected by collecting light scattered off or transmitted through fine structures on the surface of the object. A specially designed objective typically directs the light toward the object and collects the scattered or transmitted light from the object. The amount of information about the fine structures on the object depends on the spectral bandwidth of the light and the numerical aperture (NA) of the objective. Increasing the spectral bandwidth of the light and the NA of the objective, increases the amount of information that can be collected by the objective. Therefore, wide spectral bandwidth and high NA objectives are desired. From a manufacturing perspective, however, wide spectral bandwidth and high NA objectives are problematic because the objective should reduce chromatic aberrations (axial color) caused by the wide spectral bandwidth and reduce obscurations caused by the high NA.

In general, three classes of objectives may be used to collect information about an object (e.g., reticle or wafer): (i) an all refractive objective; (ii) an all reflective objective; or (iii) a catadioptric objective. Although all refractive objectives may not have a central obscuration, these types of objectives typically do not adequately correct chromatic aberrations (axial color) caused by the wide spectral bandwidth at DUV wavelengths. In addition, there is a limited number of refractive materials that can transmit high energy electromagnetic radiation (such as, deep ultraviolet (DUV)), further constraining the types of all refractive objectives that can be manufactured with desirable characteristics. Accordingly, all refractive objectives are not desirable for object-inspection purposes.

Unlike an all refractive objective, all reflective and catadioptric objectives can adequately correct chromatic aberrations (axial color). This is because reflective surfaces are apochromatic (i.e., reflective surfaces can reduce chromatic aberrations by combining three colors to a single focus). Unfortunately, conventional, rotationally-symmetric all reflective and catadioptric objectives typically have a central obscuration. Any obscuration is undesirable because it reduces the amount of collected light—and therefore the amount of information that can be collected about the fine structures of the object (e.g., reticle or wafer). Although it may be possible for an all reflective objective to be configured without a central obscuration, these types of all reflective objectives are typically not rotationally symmetric, resulting in undesirable size and packaging constraints. More importantly these all reflective objectives will have high-NA limitations. Accordingly, like all refractive objectives, all reflective objectives are not desirable for object-inspection purposes.

SUMMARY

Given the foregoing, what is needed is a high NA catadioptric objective without a central obscuration, and applications thereof.

Embodiments of the present invention are directed to a high NA catadioptric objective without a central obscuration, and applications thereof. Such an objective can operate through a wide spectral bandwidth of light, including deep ultraviolet (DUV) radiation. Importantly, refractive elements in the objective can be manufactured from a single type of material (such as, for example, $CaF_2$ and/or fused silica). In addition, the elements of such an objective are rotationally symmetric about an optical axis.

An embodiment of the present invention provides an objective for inspecting a substrate using scattered radiation, including a first optical group, a second optical group, and a beamsplitter. The first optical group reduces chromatic aberrations due to a spectral range of radiation and transforms the radiation of the first polarization into radiation of a second polarization. The second optical group increases a numerical aperture of the objective and focuses the radiation of the second polarization onto the substrate. The beamsplitter provides radiation of the first polarization to the first optical group and radiation of the second polarization to the second optical group.

Another embodiment of the present invention provides an objective for inspecting a substrate using scattered radiation, including a first optical group, a second optical group, and a folding mirror. The first optical group reduces chromatic aberrations due to a spectral range of radiation. The second optical group increases a numerical aperture of the objective and focuses radiation onto the substrate. The folding mirror provides off-axis radiation to the pupil of the objective.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present invention is directed to a high NA catadioptric objective without obscuration, and applications thereof. In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A high NA catadioptric objective in accordance with an embodiment of the present invention eliminates a central obscuration (which is present in conventional high NA all reflective objectives), while correcting for chromatic aberrations (which typically cannot be corrected using all refractive objectives in the DUV spectrum range). In one embodiment, the central obscuration is eliminated by using a polarized beamsplitter that is configured to pass radiation of a first polarization (such as, parallel polarized (p-polarized) radiation) and reflect radiation of a second polarization (such as, sigma polarized (s-polarized) radiation). In another embodiment, the central obscuration is eliminated by using one or more folding mirrors to direct off-axis radiation into the pupil of the objective.

Before describing such objectives in detail, however, it is instructive to present an overview of, and terminology used to describe, a lithographic apparatus that may be used in accordance with an embodiment of the present invention. For example, an objective of an embodiment of the present invention may be used to inspect a recticle of, and/or a wafer patterned by, the lithographic apparatus.

II. Overview and Terminology

Figure 1A:
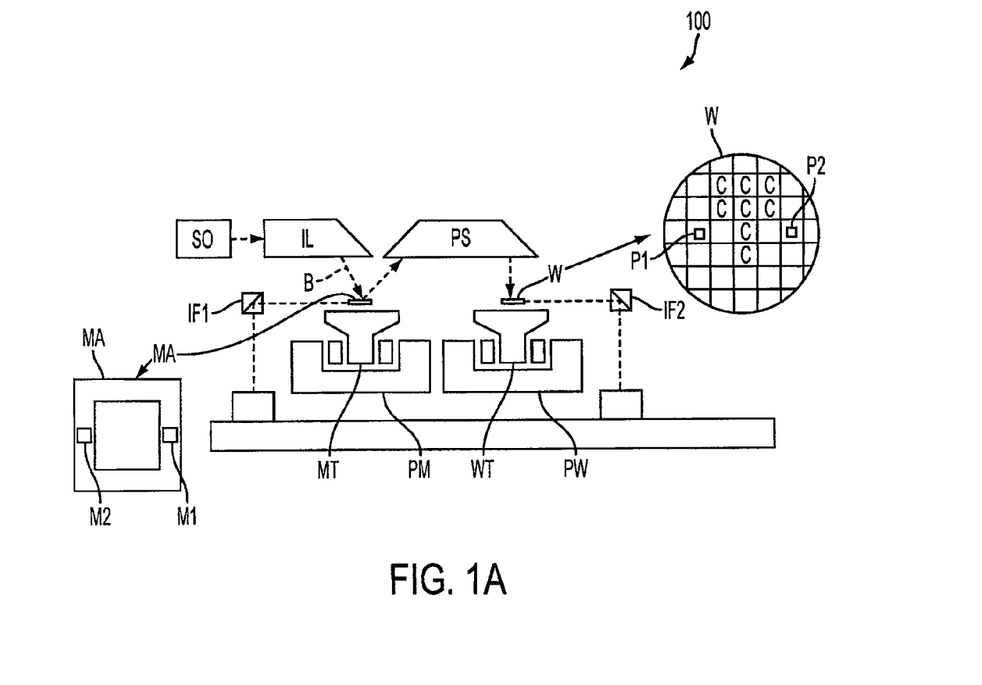
FIGS. 1A and 1B respectively depict reflective and transmissive lithographic apparatuses in accordance with embodiments of the present invention.
Figure 1B:
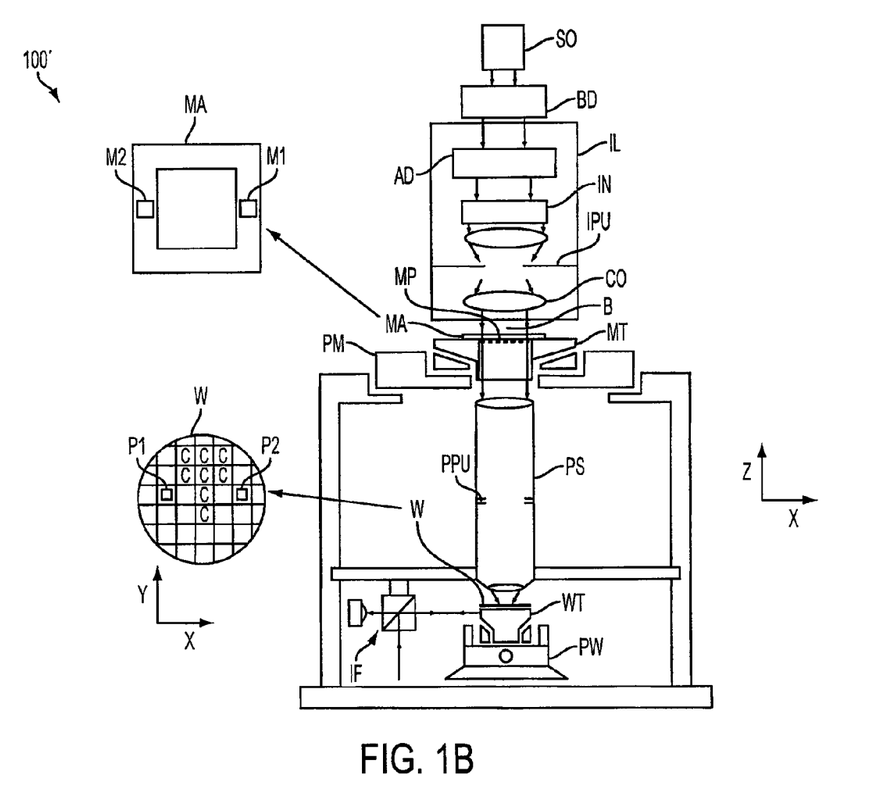

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B. In some embodiments, for example, the illumination system IL may provide linearly polarized light, as described in more detail below.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil IPU of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

The projection system has a pupil PPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

III. Example Objectives without Central Obscuration

As set forth above, embodiments of the present invention are directed to a high NA catadioptric objective without central obscuration. Such an objective is very desirable in, for example, (i) IC metrology (reticle and/or wafer inspection), (ii) high-resolution imaging spectroscopy and scatterometry, and (iii) other applications requiring a combination of high NA, large field of view (FOV), and/or wide spectral bandwidth. Objectives in accordance with embodiments of the present invention may be configured to (A) include a polarized beamsplitter and/or (B) use off-axis radiation, as described in more detail below.

A. Catadioptric Objectives that Include a Polarized Beamsplitter

In accordance with embodiments of the present invention, a catadioptric objective includes a polarized beamsplitter to eliminate a central obscuration while offering a high level of chromatic aberrations correction due to the reflective elements. The polarized beamsplitter is configured to pass radiation of a first polarization (such as parallel polarized (p-polarized) radiation) and reflect radiation of a second polarization (such as sigma polarized (s-polarized) radiation).

In such embodiments, the objective also includes a first optical group and a second optical group. The first optical group has a lens with negative optical power positioned close to a concave mirror. The concave mirror (in combination with the negative optical power lens) is configured to correct axial color and field curvature. The second optical group provides a high numerical aperture (NA) and focuses radiation onto an object (e.g., reticle or wafer) under inspection. Importantly, the second optical group typically includes refractive, not reflective, elements—thereby avoiding a central obscuration typically included in conventional high NA systems with reflecting elements.

FIGS. 2-5 respectively depict example objectives 200, 200', 200", and 200'" that each include a polarized beamsplitter 202 (for example, a beamsplitter cube) in accordance with an embodiment of the present invention. In each configuration, the objective also includes a quarter-wave plate 204, negative power lenses 206, 210, a positive power lens 212, and a concave mirror 208. Positive power lens 212 is configured to provide the objective with a high NA. Concave mirror 208 is configured to correct field curvature and chromatic aberrations (axial color). Negative power lens 206 and 210 may also be configured to help correct field curvature and chromatic aberrations (axial color). In addition, negative power lens 210 is configured to increase the working distance between beamsplitter 202 and object 214.

Figure 2:
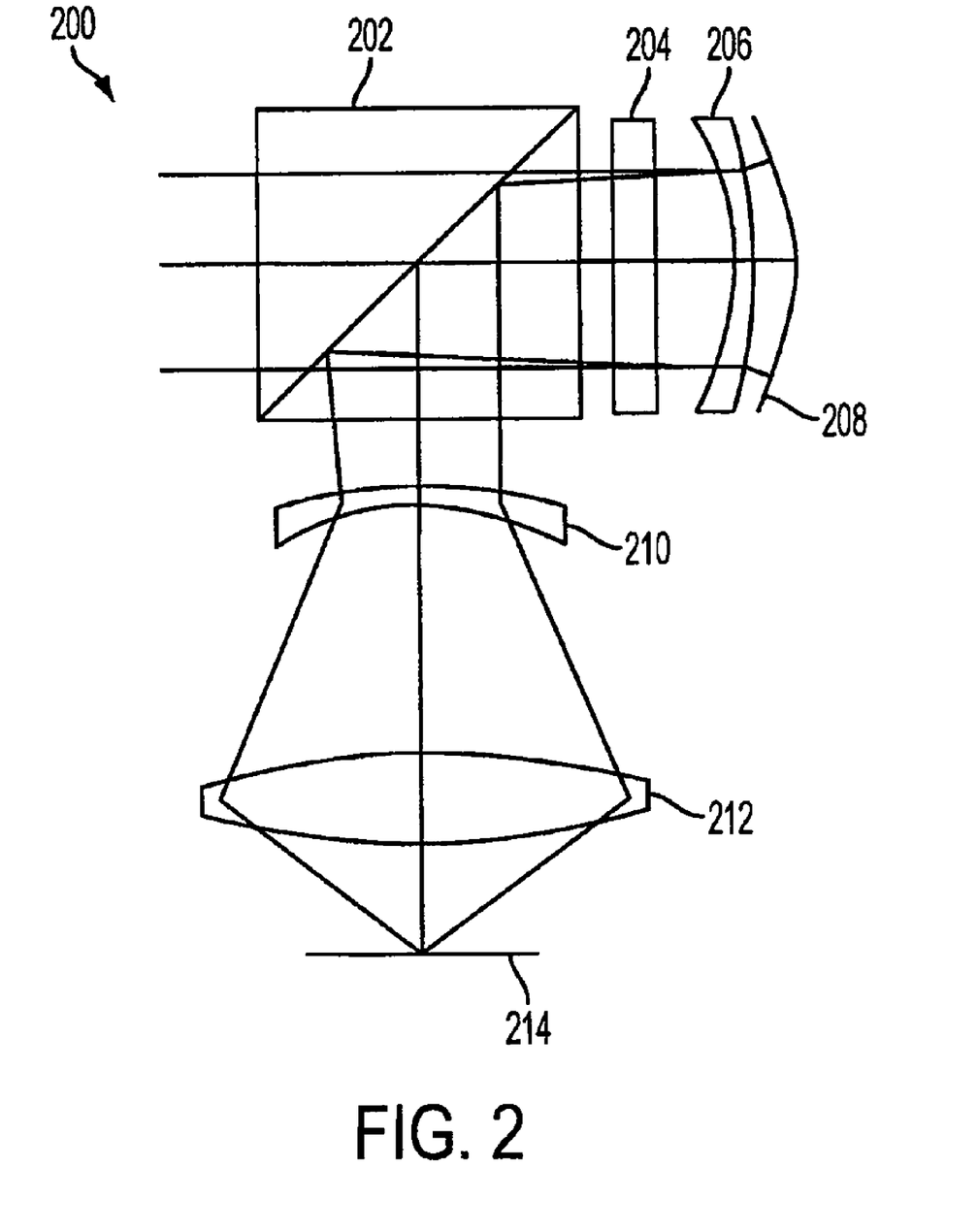
FIG. 2 depicts an example objective that uses a polarized beamsplitter in accordance with an embodiment of the present invention.
Figure 3:
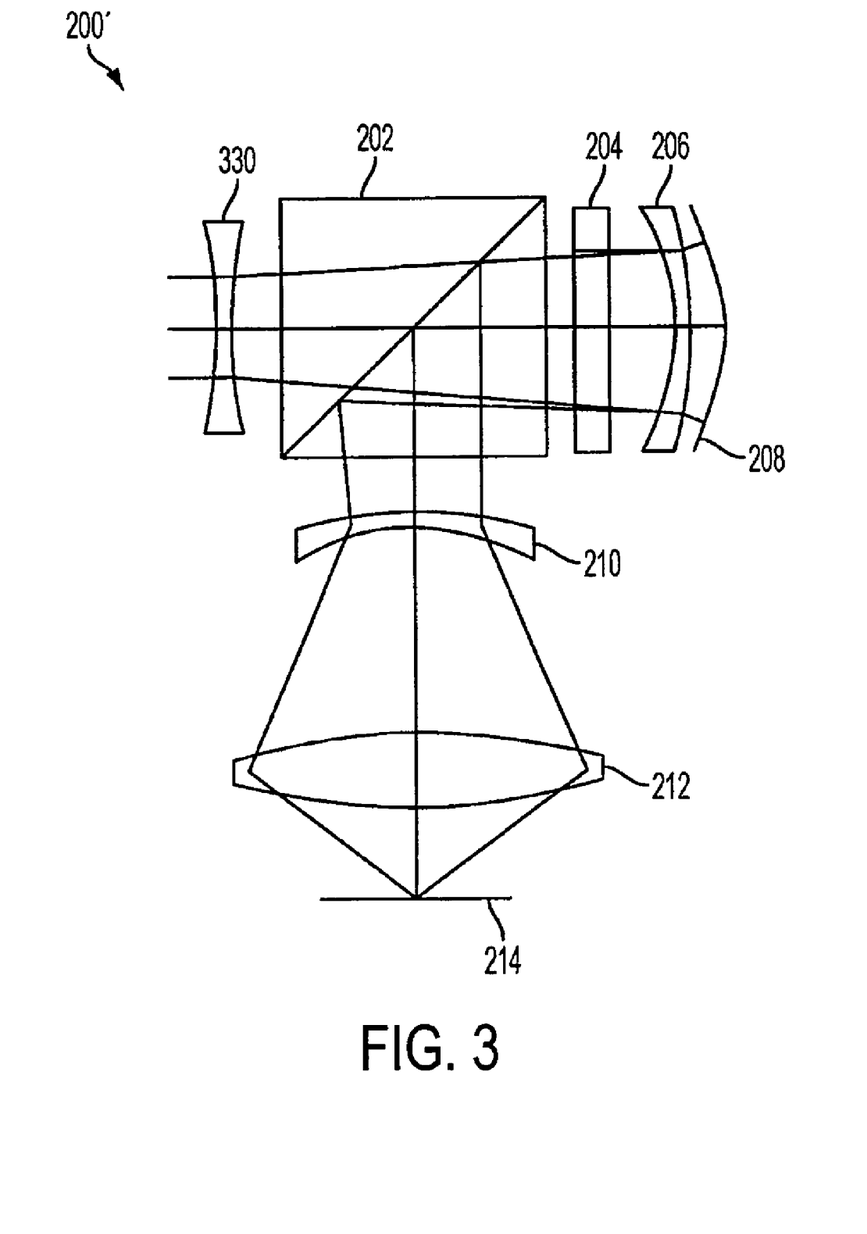
FIG. 3 depicts an example modification to the objective of FIG. 2.
Figure 4:
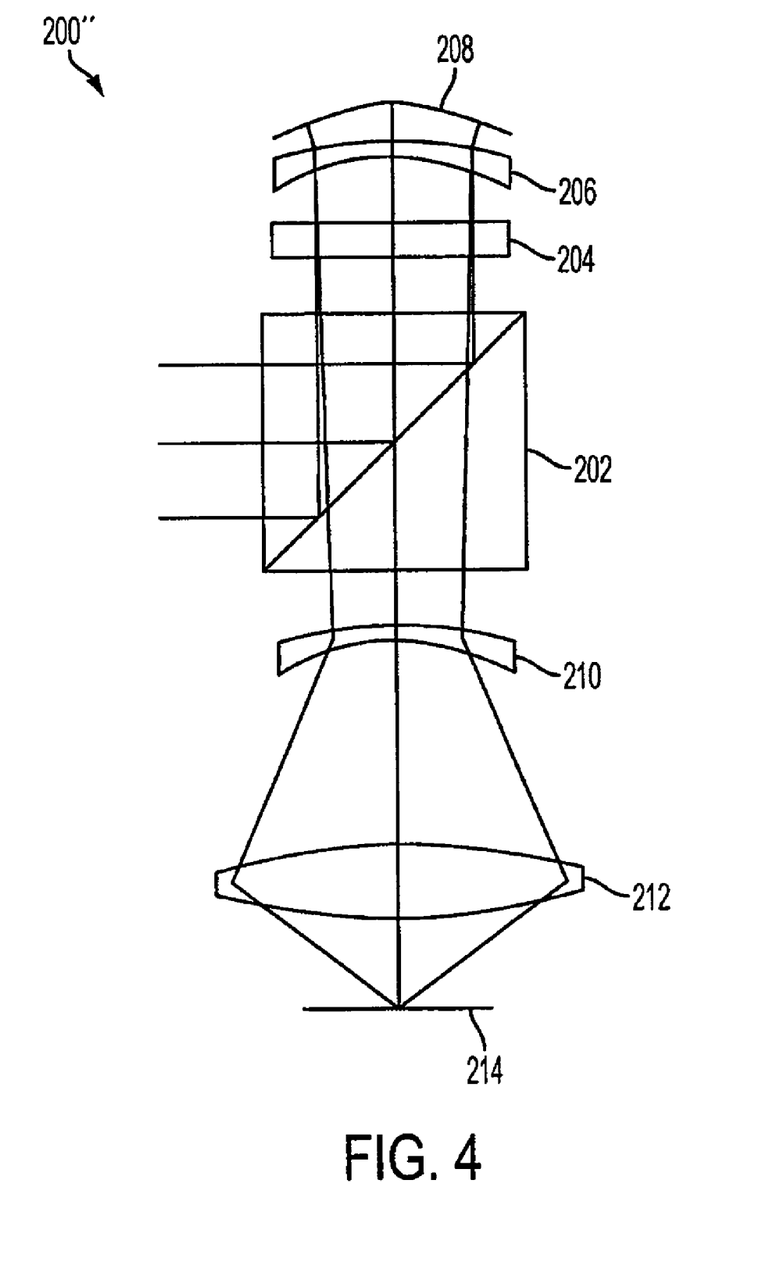
FIG. 4 depicts another example objective that uses a polarized beamsplitter in accordance with an embodiment of the present invention.
Figure 5:
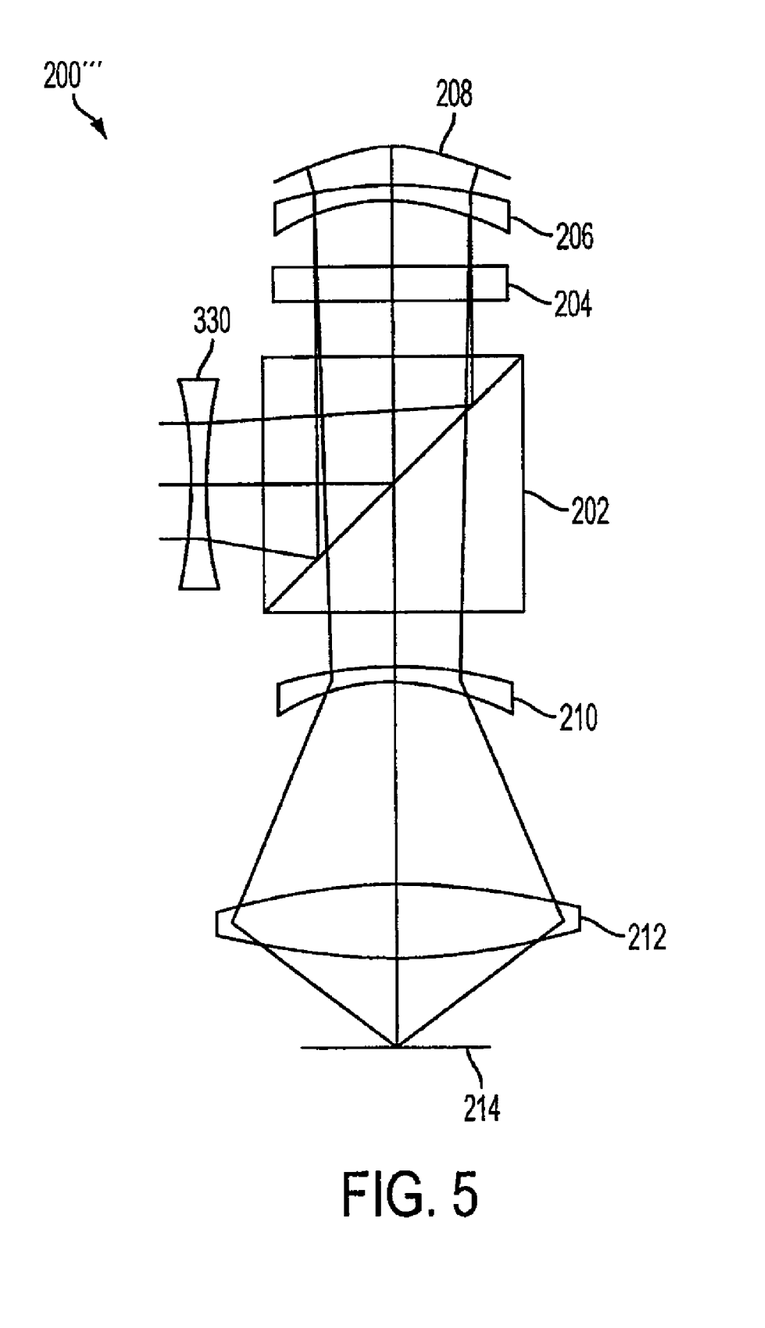
FIG. 5 depicts an example modification to the objective of FIG. 4.

For the objectives 200, 200', 200", and 200'" of FIGS. 2-5, the object plane is at infinity. The image plane coincides with an object (reticle, wafer, or sample) 214. The main difference between the embodiments shown in FIGS. 2 and 3 and the embodiments shown in FIGS. 4 and 5 is the order of reflection/refraction of light at beamsplitter 202, as described in more detail below.

Referring to objective 200 of FIG. 2, beamsplitter 202 is configured to have high transmission for radiation of a first type of polarization (such as p-polarized radiation) and high reflection for radiation of a second type of polarization (such as s-polarized radiation), or vice versa, wherein the first and second types of polarization are out of phase by 180 degrees. Objective 200 may be configured to collect scattered light from object 214 ("scattering embodiment") or to collect light transmitted through object 214 ("transmissive embodiment"). Each of these embodiments is described in more detail below.

In a scattering embodiment, beamsplitter 202 receives linearly polarized radiation of the first type from an illumination source (such as, for example, illumination source IL of FIGS. 1A and/or 1B). The linearly polarized radiation transmits through beamsplitter 202, then quarter-wave plate 204, negative power lens (or lens group) 206, and reaches concave mirror 208.

After reflection off concave mirror 208, the radiation again travels through negative power lens 206 and quarter-wave plate 204, and is incident on beamsplitter 202. Because the radiation passes through quarter-wave plate 204 twice, the radiation is transformed from radiation of the first type of polarization into radiation of the second type of polarization (e.g., from p-polarized radiation into s-polarized radiation). Accordingly, beamsplitter 202 reflects the radiation toward negative power lens 210. The radiation then reaches object 214 (i.e., the plane being investigated) after transmitting through negative power lens 210 and positive power lens 212. The alteration of negative refractive power lens 206, positive reflective power mirror 208, negative refractive power lens 210 then positive refractive power lens 212 is what gives the flexibility of the system to correct point aberrations, field aberrations, and chromatic aberrations. As mentioned above, the main function of concave mirror 208 and negative refractive power lens 206 is to correct axial color.

After incidence on object 214, the radiation is reflected (scattered) back through objective 200 in the reverse order of that described above. The reflected (scattered) radiation is collected and used to inspect/analyze structures on and/or of object 214.

In a transmissive embodiment, radiation is incident on object 214 from the opposite direction of objective 200, which in the embodiment of FIG. 2 corresponds to radiation impinging on object 214 from below. In this embodiment, the incident radiation transmits through object 214 and is directed toward beam splitter 202 by positive power lens 212 and negative power lens 210. Beam splitter 202 reflects radiation toward quarter-wave plate 204, negative power lens 206, and concave mirror 208. The radiation then reflects off concave mirror 208 and passes through negative power lens 206, quarter-wave plate 204, and beam splitter 202 and is collected for inspection/analysis of object 214 in a similar manner to that described above.

FIG. 4 depicts an objective 200" that is similar to objective 200 of FIG. 2. Unlike objective 200 of FIG. 2, however, in the example of FIG. 4 beamsplitter 202 is configured to have high reflection for radiation of the first type of polarization and high transmission for radiation of the second type of polarization. Accordingly, radiation first reflects off beamsplitter 202 and then goes through the beamsplitter 202 after reflection off concave mirror 208. The configuration depicted in FIG. 4 also alters the position of quarter-wave plate 204, negative power lens 206, and concave mirror 208 relative to the image plane, which in turn alters the space occupied by the optical elements of objective 200". Objective 200" may be used, for example, as an alternative to objective 200 depending on the packaging specifications of a given inspection system.

FIGS. 3 and 5 respectively illustrate embodiments in which an additional lens 330 is included before beamsplitter 202. Lens 330 helps to control the range of angles of incidence on the surface of beamsplitter 202, which affects the efficiency of beamsplitter 202. In addition, lens 330 is beneficial for correction of (chromatic) aberrations. With the exception of lens 330, objective 200' of FIG. 3 is substantially similar to objective 200 of FIG. 2, and objective 200''' of FIG. 5 is substantially similar to objective 200" of FIG. 4.

Although the objectives depicted in FIGS. 2-5 may have been described above in terms of radiation being reflected off object 214, it is to be appreciated that this is for illustrative purposes only, and not limitation. A person skilled in the relevant art(s) will appreciate that these objectives can be used in embodiments in which radiation is reflected off or transmitted through object 214. In transmissive embodiments, for example, radiation may enter objectives 200, 200', 200", and/or 200''' via object 214, rather than directly from an illumination source as illustratively described above for the reflective (scattering) embodiments.

B. Catadioptric Objectives that Use Off-Axis Radiation

In accordance with an embodiment of the present invention, a catadioptric objective uses off-axis radiation to eliminate a central obscuration (which is typically found in conventional high NA all reflective or catadiotric objectives), while correcting for chromatic aberrations (which is typically not corrected for in all refractive objectives). In this embodiment, a concave mirror (included in a first optical group) corrects chromatic aberrations (axial color) and field curvature. One or more negative power lens are also included to assist in the correction of chromatic aberrations (axial color) and field curvature. The high NA is created by one or more all refractive elements in a second optical group. Importantly, the second optical group typically includes refractive, not reflective, elements. The combination of off axis illumination, intermediate image planes, and proper folding is what avoids a central obscuration typically included in conventional high NA all reflective or catadiotric objectives.

FIGS. 6-9 depict various embodiments of an objective that uses off-axis radiation to eliminate a central obscuration of typical high NA all reflective or catadiotric objectives, while correcting for chromatic aberrations (typically found in all refractive objectives). Each of these embodiments includes: positive power lenses 602, 604, 612 and 616; negative power lens 606; a concave mirror 608; and a folding mirror 610. The object plane is at infinity. The image plane coincides with an object (e.g., reticle or wafer).

The objectives of FIGS. 6-9 may be used to collect radiation that is scattered off object 614 ("scattering embodiments") or to collect radiation that is transmitted through object 614 ("transmissive embodiments"). In scattering embodiments, radiation enters the objective through lens 602, is conditioned by the other elements of the objective, and then is incident on object 614. The radiation is then scattered off object 614 and directed back through the objective in the reverse order from which it entered. In the transmissive embodiments, radiation is first transmitted through object 614 and then traverses through the objective in a similar manner to the radiation that is scattered off objective 614 in the scattering embodiments. For illustrative purposes, and not limitation, scattering embodiments are described in detail below. The operation of transmissive embodiments will be apparent to persons of ordinary skill in the art based on the description provided herein.

Referring generally to FIGS. 6-9, positive power lens 616 is configured to provide the objective with a high NA. Concave mirror 608 along with negative power lens 606 is configured to correct field curvature and chromatic aberrations (axial color). Positive power lens 602 is configured to provide a first intermediate image 603. In addition to their functionality described above, concave mirror 608 and negative power lens 606 also act as a 1-X optical relay to re-image the first intermediate image 603 as a second intermediate image 605. Folding mirror 610 provides the second intermediate image 605 to positive power lens 612 and positive power lens 616. Positive power lens 604 is configured to create an intermediate pupil on concave mirror 608.

Figure 6:
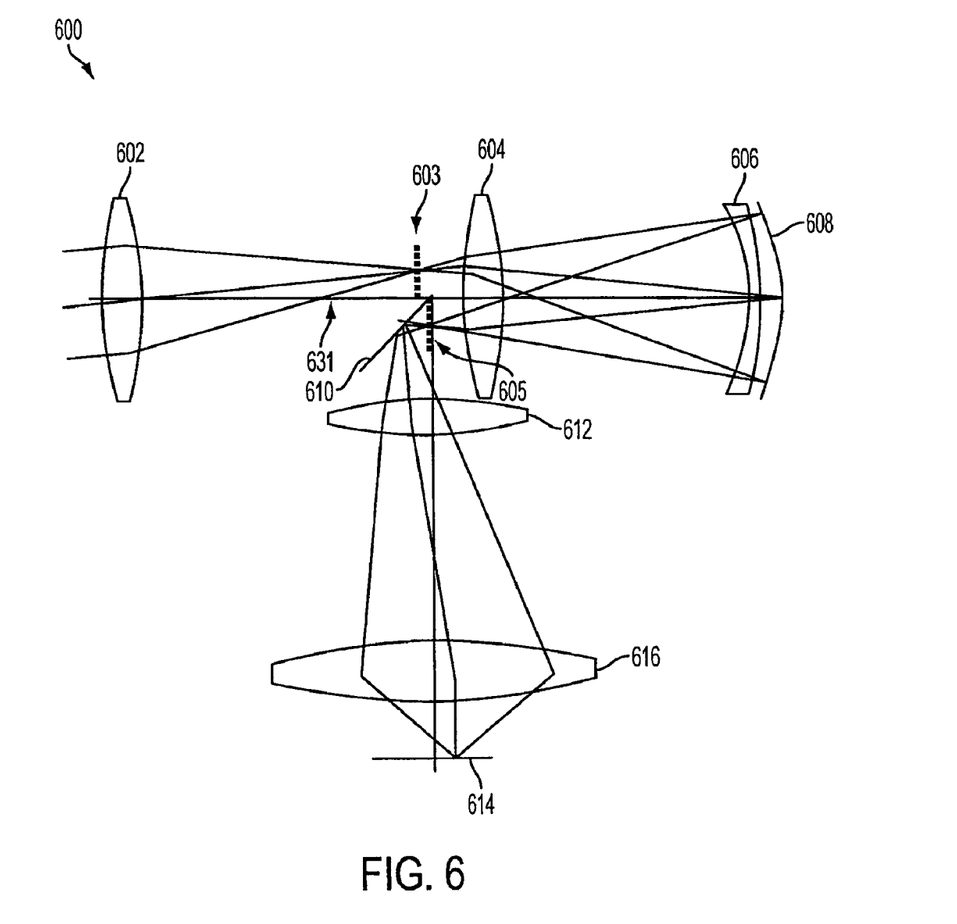
FIG. 6-9 depict example objectives that use off-axis radiation in accordance with embodiments of the present invention.

With specific reference to FIG. 6, an objective 600 includes folding mirror 610, concave mirror 608, and lenses 602, 604 (optional), 606, 612, and 616. Objective 600 provides two intermediate images 603 and 605. Lens 602 focuses radiation to first intermediate image 603. Intermediate image 603 is reflected by folding mirror 610 and reimaged by a 1-X catadioptric relay comprising concave mirror 608 and lens 606 to create second intermediate image 605.

Figure 9:
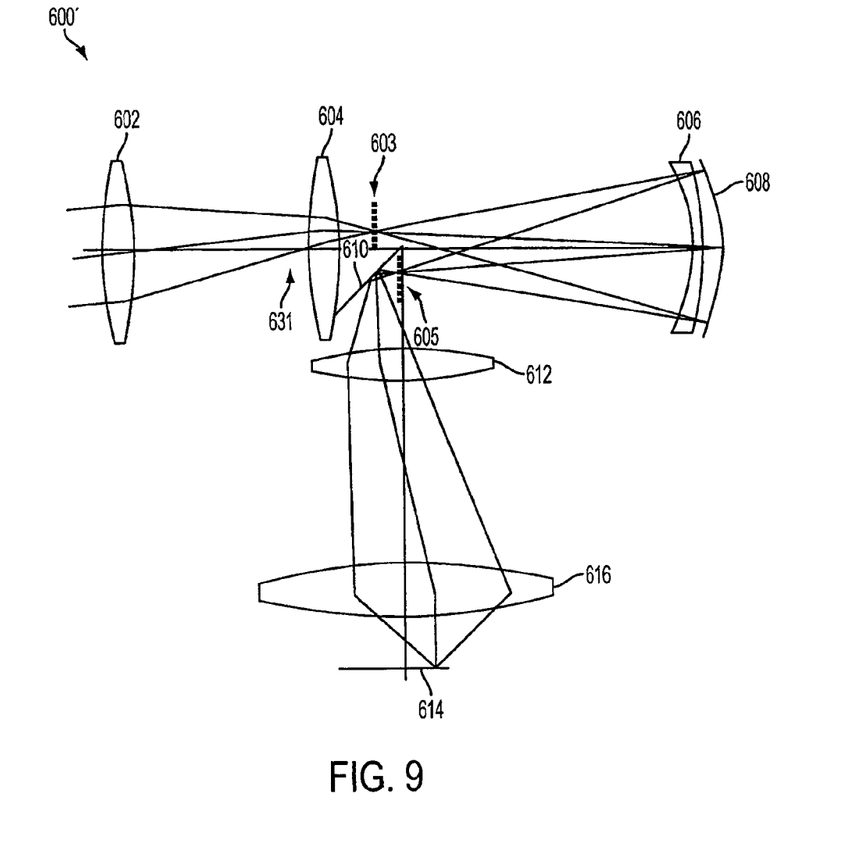

Lens 604 can be placed after intermediate image 603 (as depicted in FIG. 6) or before intermediate image 603 (as depicted in FIG. 9). Lens 604 is located close to the intermediate image 603 and used to control the position of the intermediate pupil of objective 600. This pupil should coincide or be close to concave mirror 608.

Intermediate image 605 is reimaged onto object 614 by a refractive relay including positive power lens 612 and 616.

After incidence on object 214, the radiation is reflected (scattered) back through objective 600 in the reverse order of that described above. The reflected (scattered) radiation is collected and used to inspect/analyze structures on object 214.

Figure 7:
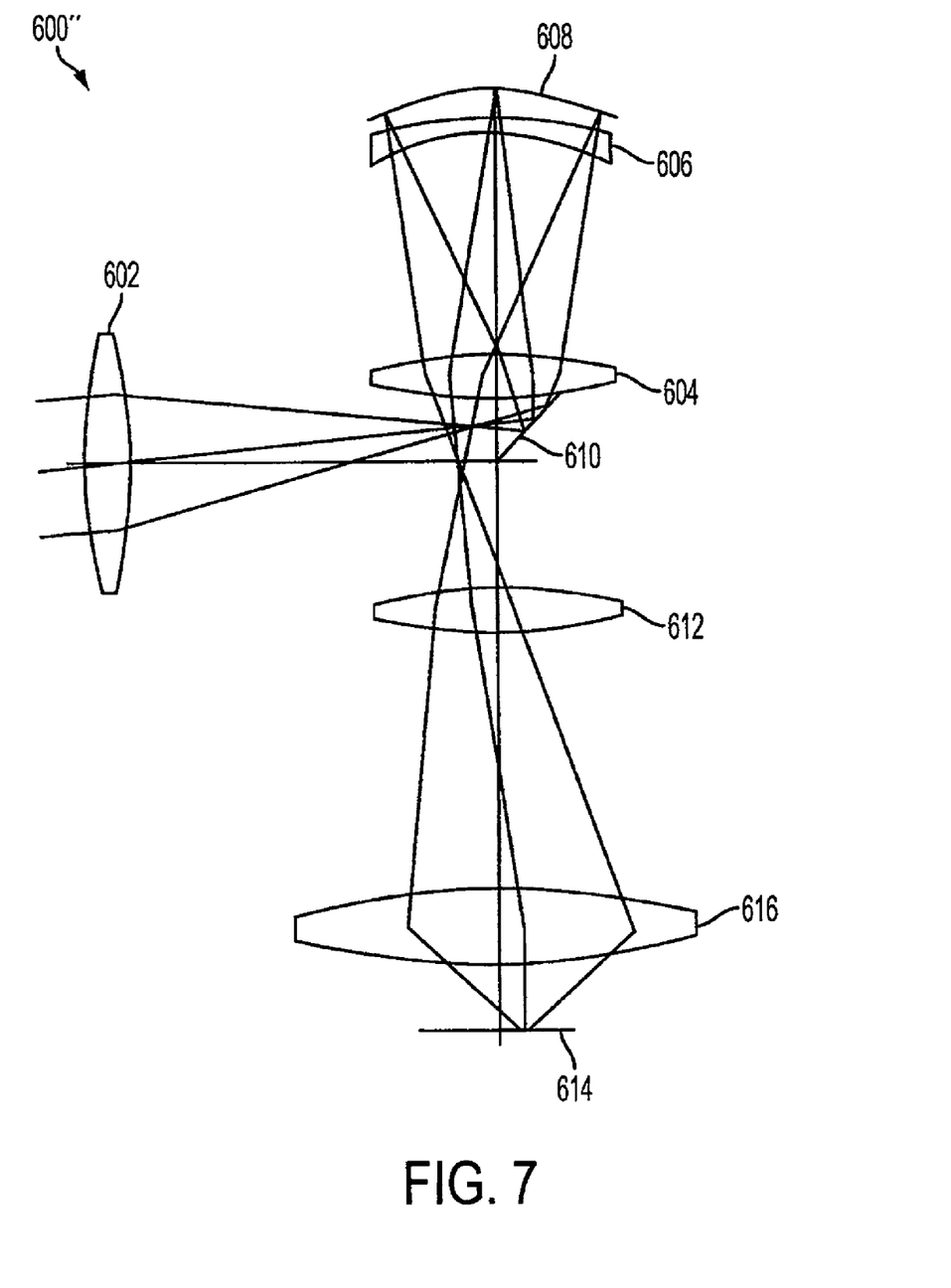
Figure 8:
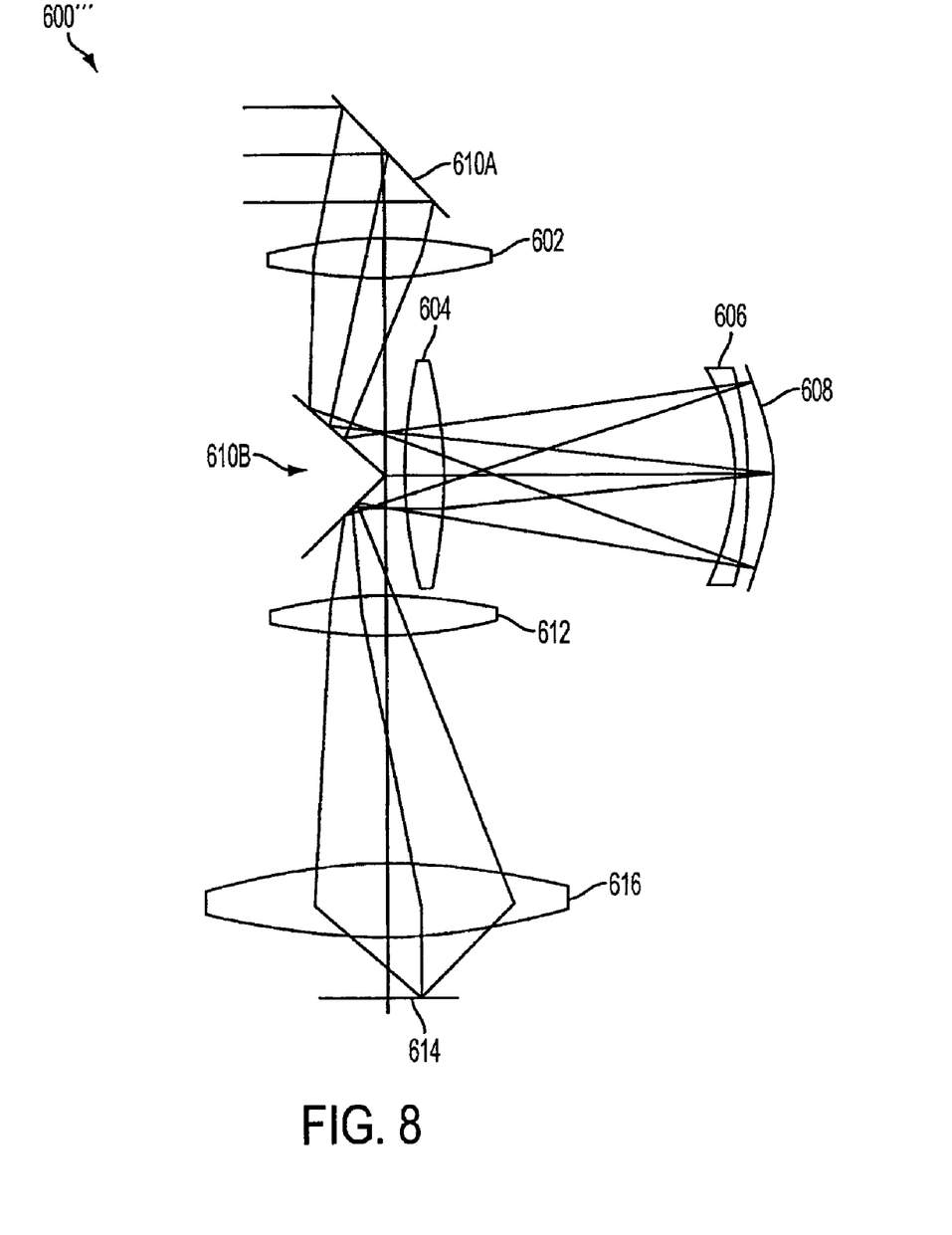

Objective 600 may be arranged in alternative configurations, as illustrated in FIG. 7 (using one folding mirror 610) and FIG. 8 (using two folding mirrors 610A and 610B). Different folding schematics may be used based on desired design characteristics.

Concave mirror 608 and negative lens 606 correct axial color and field curvature aberrations. Chromatic correction can be achieved using one glass type—such as, for example, fused silica—in all refractive groups (e.g., lenses 602, 604, 606, 612, and 616).

The optical elements of objectives 600, 600', 600", and 600'" (except folding mirror 610) are rotationally symmetrical about the optical axis. Folding mirror 610 blocks radiation traveling parallel to the optical axis 631 (see FIGS. 6 and 9). Therefore, the useful area of field is located off-axis as shown in FIGS. 6-9. Importantly, the pupils of objectives 600, 600', 600", and 600'" do not have a central obscuration as is typical in conventional high NA all reflective or catadiotric objectives.

Although the objectives depicted in FIGS. 6-9 are described above in terms of radiation being reflected off object 614, it is to be appreciated that this is for illustrative purposes only, and not limitation. A person skilled in the relevant art(s) will appreciate that these objectives can also be used in embodiments in which radiation is transmitted through object 614. In such embodiments, for example, radiation may enter objectives 600, 600', 600", and/or 600'" via object 614, rather than directly from an illumination source as illustratively described above.

IV. Conclusion

Described above are embodiments of a high NA catadiotric objective without obscuration, and applications thereof. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A catadioptric objective for inspecting a substrate using scattered radiation, comprising:
    a first optical group configured to transform radiation of a first polarization into radiation of a second polarization, wherein the first optical group comprises adjacently disposed at least two optical elements and a reflective element to reduce chromatic aberrations due to a spectral range of the radiation;
    a second optical group comprising a positive power refractive element configured to increase a numerical aperture of the catadioptric objective and a negative power refractive element; and
    a beamsplitter configured to provide radiation of the first polarization to the first optical group and radiation of the second polarization to the second optical group, wherein the negative power refractive element and the positive power refractive element of the second optical group disposed in order from the beamsplitter to an object and the negative power refractive element configured to increase the working distance between the beamsplitter and the object.

2. The objective of claim 1, wherein the beamsplitter transmits radiation of the first polarization and reflects radiation of the second polarization.

3. The objective of claim 1, wherein the beamsplitter reflects radiation of the first polarization and transmits radiation of the second polarization.

4. The objective of claim 1, further comprising:
    a lens configured to control a range of angles from which the beamsplitter receives radiation.

5. The objective of claim 1, wherein the at least two optical elements comprise a quarter-wave plate.

6. The objective of claim 1, wherein the at least two optical elements comprise a negative power lens.

7. The objective of claim 1, wherein the at least two optical elements comprise a quarter-wave plate and a negative power lens disposed between the beam splitter and the reflective element.

8. The objective of claim 1, wherein the first optical group comprises a quarter-wave plate, a negative power lens and a concave mirror in order from the beam splitter to the concave mirror.

9. The objective of claim 1, wherein the reflective element is the last element of the first optical group.

10. The objective of claim 1, wherein one optical element of the at least two optical elements adjacent the beam splitter is configured to transform radiation of the first polarization into radiation of the second polarization.

11. A catadioptric objective for inspecting a substrate using scattered radiation, comprising:
    a first optical group configured to transform radiation of a first polarization into radiation of a second polarization, wherein the first optical group comprises a reflective element to reduce chromatic aberrations due to a spectral range of the radiation;
    a second optical group comprising a refractive element configured to increase a numerical aperture of the catadioptric objective; and
    a beamsplitter configured to provide radiation of the first polarization to the first optical group and radiation of the second polarization to the second optical group, wherein the first optical group comprises a quarter-wave plate, a negative power lens, and a concave mirror.

12. A method for inspecting a substrate using a catadioptric objective, comprising:
    transforming radiation of a first polarization into radiation of a second polarization using a first optical group of the catadioptric objective, wherein the first optical group comprises adjacently disposed at least two optical elements and a reflective element configured to reduce chromatic aberrations due to a spectral range of the radiation;
    increasing a numerical aperture of the catadioptric objective using a second optical group, wherein the second optical group comprises a positive power refractive element and a negative power refractive element; and providing radiation of the first polarization to the first optical group and radiation of the second polarization to the second optical group using a beamsplitter, wherein the negative power refractive element and the positive power refractive element of the second optical group disposed in order from the beamsplitter to an object and the negative power refractive element configured to increase the working distance between the beamsplitter and the object.

13. The method of claim 12, wherein the providing radiation of the first polarization to the first optical group and radiation of the second polarization to the second optical group comprises:

transmitting radiation of the first polarization; and
reflecting radiation of the second polarization.

14. The method of claim 12, wherein the providing radiation of the first polarization to the first optical group and radiation of the second polarization to the second optical group comprises:

reflecting radiation of the first polarization; and
transmitting radiation of the second polarization.

15. The method of claim 12, further comprising:

controlling a range of angles from which the beamsplitter receives radiation.

16. The method of claim 12, further comprising using at least one of a quarter-wave plate, a negative power lens, and a concave mirror as the first optical group.

17. A method for inspecting a substrate using a catadioptric objective, comprising:

transforming radiation of a first polarization into radiation of a second polarization using a first optical group of the catadioptric objective, wherein the first optical group comprises a reflective element configured to reduce chromatic aberrations due to a spectral range of the radiation;

increasing a numerical aperture of the catadioptric objective using a second optical group, wherein the second optical group comprises a refractive element;

providing radiation of the first polarization to the first optical group and radiation of the second polarization to the second optical group; and using a quarter-wave plate, a negative power lens, and a concave mirror as the first optical group.

* * * * *